United States Patent
Suzuki

(10) Patent No.: US 6,979,634 B2
(45) Date of Patent: Dec. 27, 2005

(54) MANUFACTURING METHOD FOR SEMICONDUCTOR DEVICE HAVING A T-TYPE GATE ELECTRODE

(75) Inventor: So Suzuki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/630,934

(22) Filed: Jul. 31, 2003

(65) Prior Publication Data

US 2004/0097074 A1   May 20, 2004

(30) Foreign Application Priority Data

Nov. 20, 2002   (JP) ............... 2002-335950

(51) Int. Cl.⁷ ............... H01L 21/3205; H01L 21/4763
(52) U.S. Cl. ............... 438/585; 438/579; 438/592
(58) Field of Search ............... 438/579, 581, 438/692, 585, 592

(56) References Cited

U.S. PATENT DOCUMENTS

| | | |
|---|---|---|
| 5,268,330 A | 12/1993 | Givens et al. |
| 5,783,475 A | 7/1998 | Ramaswami |
| 5,783,479 A | 7/1998 | Lin et al. |
| 5,920,783 A | 7/1999 | Tseng et al. |
| 6,180,501 B1 * | 1/2001 | Pey et al. ............. 438/592 |
| 6,239,007 B1 * | 5/2001 | Wu ............. 438/585 |
| 6,309,933 B1 * | 10/2001 | Li et al. ............. 438/291 |
| 6,448,163 B1 * | 9/2002 | Holbrook et al. ............. 438/585 |
| 2002/0016042 A1 * | 2/2002 | Xia et al. ............. 438/291 |
| 2003/0151097 A1 * | 8/2003 | Ryu et al. ............. 257/362 |

FOREIGN PATENT DOCUMENTS

| | | |
|---|---|---|
| JP | 05-063002 | 3/1993 |
| JP | 07-066406 | 3/1995 |
| JP | 08-037301 | 2/1996 |
| JP | 10-335651 | 12/1998 |
| JP | 2000-036594 | 2/2000 |
| JP | 2000-150879 | 5/2000 |
| WO | WO 01/11669 | 2/2001 |

* cited by examiner

*Primary Examiner*—George Fourson
*Assistant Examiner*—Fernando L. Toledo
(74) *Attorney, Agent, or Firm*—Rabin & Berdo, PC

(57) ABSTRACT

This invention provides a semiconductor device manufacturing method including forming a T type gate electrode having a wide region in an upper portion, the method including steps of: forming rectangular gate polysilicon; forming a nitride film covering the polysilicon; forming an oxide film thick on the nitride film; etching back the oxide film to expose the nitride film; etching the exposed nitride film, exposing the gate polysilicon, and forming a space; forming undoped polysilicon burying the space; etching back the undoped polysilicon to form a wide portion in the upper portion of the gate polysilicon; and etching the oxide film and the nitride film; siliciding the wide undoped silicon to form titanium suicide (or cobalt silicide). This manufacturing method makes it possible to easily form the T type gate electrode with good yield.

11 Claims, 7 Drawing Sheets

MANUFACTURING METHOD FOR SEMICONDUCTOR DEVICE HAVING A T-TYPE GATE ELECTRODE

BACKGROUND OF THE INVENTION

The present invention relates to a method for manufacturing a semiconductor device having a T type gate electrode, and particularly relates to a semiconductor device manufacturing method which can prevent an increase in the resistance of the suicide gate of a transistor following the thinning of the suicide gate.

DESCRIPTION OF THE RELATED ART

As a method for preventing an increase in the resistance of the gate of a transistor following the thinning of the gate, a method for forming a gate to have an upper portion of the gate widened or forming a so-called T-type gate electrode is disclosed by Japanese Patent Laid-Open Publication Nos. 2000-36594 and 5-63002.

Recently, as the performances of semiconductor devices increase, transistor gates are increasingly made thinner. According to a conventional method for forming a titanium silicide gate or a cobalt silicide gate, a rectangular gate is formed first by polysilicon and a nitride film is then formed on the sidewall of the gate. Thereafter, titanium or cobalt is applied on the entire surface, a heat treatment is conducted to silicide the upper surface portion of the gate and a diffusion layer to thereby decrease the resistance of the gate and unreacted titanium or cobalt is removed, thus forming the silicide gate.

However, according to the conventional manufacturing method, as the length of the gate decreases (the gate is thinner), a polysilicon region on the gate upper surface portion in which polysilicon reacts with titanium or cobalt to form suicide is narrower. If the silicide region is narrower, reaction is finished before polysilicon is completely silicided. As a result, a gate having relatively high resistance is formed as compared with a gate having a large gate length.

Further, in the step of forming a transistor, a nitride film is formed on the sidewall of the gate, and then impurities are injected into source and drain diffusion regions while using the gate and the sidewall of the nitride film as a mask. At this time, impurities are also injected into the gate. The impurities thus injected hamper a silicide reaction and prevents the resistance of the gate from decreasing. It is known that arsenic (As), in particular, more suppresses the phase dislocation of titanium silicide and prevents the resistance of the gate from decreasing than boron (B).

As for CMOS transistors, different impurities are injected into an NMOS transistor and a PMOS transistor, so that the gates of the transistors are irregularly silicided. In addition, the resistances of the gates of the transistors are irregular, thereby making it disadvantageously impossible to obtain elements of uniform characteristics.

To solve these disadvantages which occur when the gate is made thin, there is known, for example, a method for forming a T type gate electrode as disclosed in the above-stated patent documents. By widening the upper portion of the gate while the lower portion thereof remains thin, a wide polysilicon region is completely silicided, making it possible to obtain a desired gate resistance.

However, to form the wide gate region on the thin lower gate region, the upper wide gate region is positioned relative to the thin lower gate region using a photolithographic step. The positioning is required to be conducted with high accuracy. Besides, it is difficult to form the gate uniformly in a wafer plane with good yield, thereby disadvantageously pushing up manufacturing cost.

SUMMARY OF THE INVENTION

The present invention has been made to solve the disadvantages of the conventional semiconductor device manufacturing method. It is an object of the present invention to provide a novel and improved semiconductor device manufacturing method which includes forming a T type gate electrode having a wide region in an upper portion thereof, which can simplify formation steps, uniformly form the T type gate electrode in a wafer plane with good yield, and reduce manufacturing cost.

In order to solve the problems, according to the first aspect of the present invention, there is provided a semiconductor device manufacturing method comprising steps of: forming first polysilicon serving as a gate on a semiconductor substrate; forming a first insulating film covering the first polysilicon on the semiconductor substrate so as to be thinner than the first polysilicon; forming a second insulating film on the first insulating film to be thick enough to flatten a difference in height around the first polysilicon; conducting etch-back to the second insulating film by dry etching to expose the first insulating film; etching the exposed part of the first insulating film to expose the first polysilicon and form a space; forming a second polysilicon to be thick enough to bury the space and flatten a difference in height of the space; conducting etch-back to the second polysilicon until the second insulating film is exposed, leaving the second polysilicon only in the space, and thereby forming the second polysilicon wider than a gate junction portion on the first polysilicon; removing the second insulating film; etching the first insulating film; forming high melting point metal such as titanium or silicide on the second polysilicon; siliciding the second polysilicon by a heat treatment; and removing unreacted high melting point metal.

Here, the first insulating film covering the first polysilicon can be formed to be thicker than the first polysilicon so as not to entirely remove the difference in height around the first polysilicon. Thereafter, similarly to the above, the second insulating film is formed to have such a thickness as to flatten the difference in height around the first polysilicon. The reason for forming the first insulating film to be thicker than the first polysilicon but leaving the difference in height around the first polysilicon is to expose the first insulating film only on the upper portion of the first polysilicon by etch-back.

It is preferable that a condition for etching the first insulating film is that the second insulating film is hardly etched. It is thereby possible to etch the first insulating film using the second insulating film as a mask.

It is also preferable that the second polysilicon is undoped polysilicon. With the undoped silicon, it is possible to prevent impurities from hampering a silicide reaction during siliciding.

In the method for manufacturing the polysilicon gate including the siliciding step, the wider polysilicon region than the lower portion can be formed on the thinned polysilicon gate in a self-aligned manner only by the film formation and etching steps without using the photolithographic step at all. Therefore, it is possible to decrease the number of steps and manufacture the polysilicon gate with good yield, i.e., at low cost. As siliciding can be completely conducted on the wide portion of the upper gate, the resistance of the gate can be decreased.

BRIEF DESCRIPTION OF THE DRAWINGS

FIGS. 2A to 2J are schematic cross-sectional views showing the steps of forming the silicide gate in the first embodiment, wherein FIG. 2A shows a state after a gate is formed, FIG. 2B shows a state after a nitride film is formed, FIG. 2C shows a state after the nitride film is etched, FIG. 2D shows a state after an oxide film is formed on the nitride film which covers the gate, FIG. 2E shows a state after the oxide film is etched back, FIG. 2F shows a state after the nitride film on the gate is removed, FIG. 2G shows a state after an undoped polysilicon film is formed, FIG. 2H shows a state after the undoped silicon film is etched back, FIG. 2I shows a state after the oxide film and the nitride film are etched and FIG. 2J shows a state after titanium (or cobalt) is formed;

FIGS. 3A to 3J are schematic cross-sectional views showing the steps of forming a silicide gate in the second embodiment according to the present invention, wherein FIG. 3A shows a state after a gate is formed, FIG. 3B shows a state after a nitride film is formed, FIG. 3C shows a state after an oxide film is formed, FIG. 3D shows a state after the oxide film is etched back, FIG. 3E shows a state after a nitride film is formed, FIG. 3F shows a state after an undoped polysilicon film is formed, FIG. 3G shows a state after the undoped polysilicon is etched back, FIG. 3H shows a state after the oxide film and the nitride film are etched, FIG. 3I shows a state after titanium (or cobalt) is formed and FIG. 3J shows a state after unreacted titanium (or cobalt) is removed;

DETAILED DESCRIPTION OF THE PREFERRED EMBODIMENTS

The preferred embodiments of a semiconductor device manufacturing method according to the present invention will be described hereinafter in detail with reference to the accompanying drawings. In the specification and the drawings, constituent elements having substantially the same functions and constitutions are denoted by the same reference symbols, respectively.

First Embodiment

Figure 1:
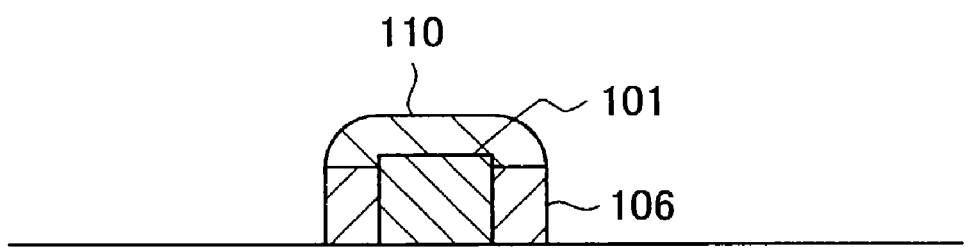
FIG. 1 is a schematic cross-sectional view of a silicide gate in the first embodiment according to the present invention.

FIG. 1 is a cross-sectional view of a gate portion formed in the first embodiment. FIGS. 2A to 2J are cross-sectional views showing the steps of forming the gate shown in FIG. 1.

Impurities (not shown) are injected first into an element formation region on a semiconductor substrate made of, for example, silicon so as to obtain a desired threshold voltage (Vt). A photolithographic step, an etching step and the other step are executed, whereby first polysilicon, e.g., rectangular gate polysilicon 101 (FIG. 2A) is formed as a lower gate having a design gate length (about 0.15 μm). The height of the gate polysilicon is preferably about 150 nm.

Thereafter, in order to obtain an LDD (Lightly Doped Drain) structure which can decrease leak current and improve reliability, impurities are injected into source and drain regions with the gate polysilicon 101 used as a mask to thereby form, for example, a low concentration, shallow n type layer (not shown).

Figure 2A:
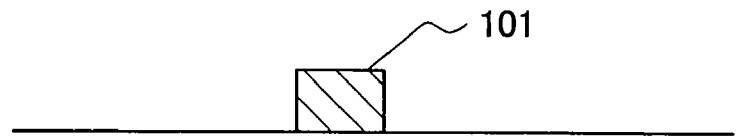
Figure 2B:
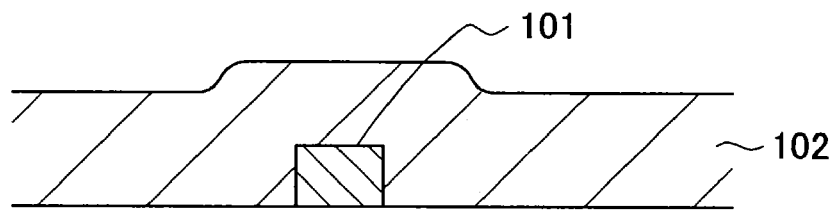
Figure 2C:
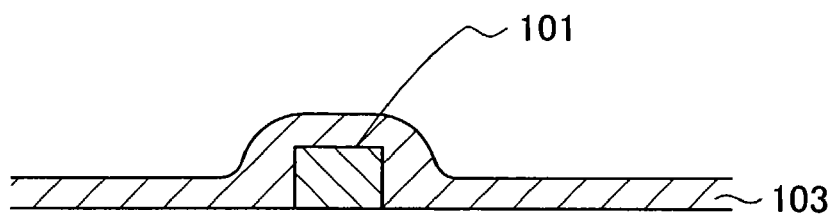

Next, a nitride film, for example, is formed as the first insulating film on the entire surface of the substrate so that the nitride film covers the gate polysilicon 101 and the thickness of the nitride film is smaller than the height of the gate polysilicon 101. If forming the nitride film having a smaller thickness than the height of the gate polysilicon, the following steps are preferably executed. A nitride film 102 having a thickness of about 200 nm is formed to be larger than the height of the gate polysilicon 101 by a CVD method (FIG. 2B). Thereafter, as shown in FIG. 2C, the entire surface of the substrate is etched back by a dry etching method until the upper portion of the gate is not exposed but covered with the nitride film 102 and a nitride film 103 having a smaller width than the height of the gate polysilicon 101 is formed. If the nitride film is initially formed to be thin, film thickness becomes irregular, in a wafer plane and desires forms cannot be obtained at respective positions in the plane.

Figure 2D:
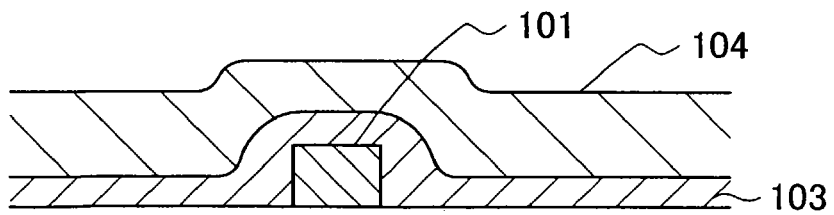

Thereafter, impurities are injected into the substrate through the nitride film 103, thereby forming, for example, a high concentration n type layer (not shown) on a contact portion in which the source and drain regions of the LDD structure contact each other. Further, an oxide film 104, for example, is formed as the second insulating film on the nitride film 103 by the CVD method to have a thickness of, for example, about 300 nm. At this time, it is preferable that the difference in height around the gate portion is eliminated by forming the oxide film 104 thick and that the oxide film 104 is flattened (FIG. 2D). The flattened oxide film 104 is etched back by the dry etching method.

Figure 2E:
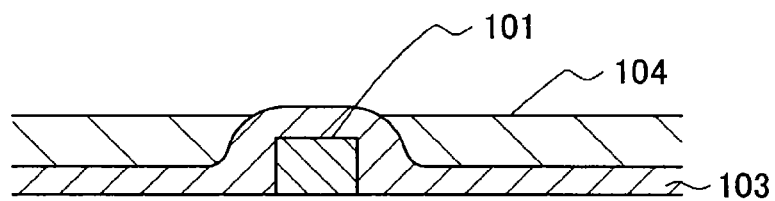
Figure 2F:
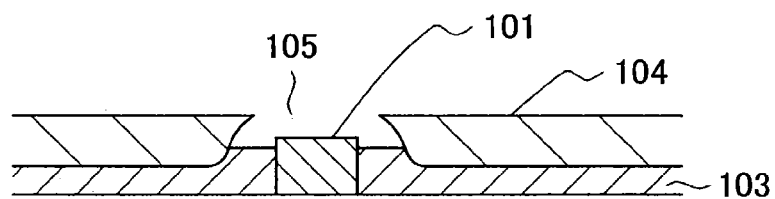

As shown in FIG. 2E, after the oxide film 104 is etched back until the nitride film 103 on the gate polysilicon 101 is exposed, the type of gas for dry etching is changed and only the exposed nitride film 103 is etched while the oxide film remains hardly etched. At this time, the nitride film 103 is etched until the upper portion of the gate polysilicon 101 is exposed, whereby a space 105 shown in FIG. 2F surrounded by the oxide film 104, the gate polysilicon 101 and the nitride film 103 is formed.

Figure 2G:
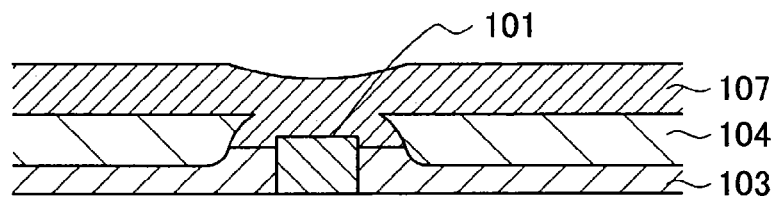
Figure 2H:
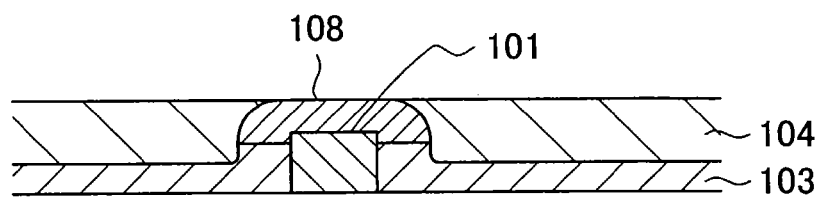

Undoped polysilicon 107 is then formed as the second polysilicon so as to bury the space 105 (FIG. 2G). The undoped polysilicon 107 is formed for the following reason. If impurity-injected polysilicon is used, impurities hamper a suicide reaction and prevent the resistance of the gate from decreasing. The undoped polysilicon 107 is formed to have a thickness of about 200 nm, whereby a dent in the space 105 is buried and the undoped polysilicon 107 is flattened. Thereafter, the entire surface of the substrate is etched back, the undoped polysilicon 107 is etched so as to expose the oxide film 104 and undoped polysilicon 108 is left in the space 105 (FIG. 2H). The undoped polysilicon 108 in the space 105 becomes an upper gate electrode.

Figure 2I:
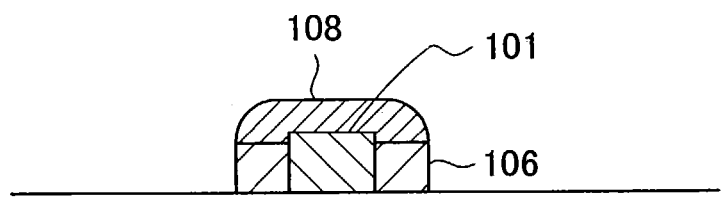

The type of etching gas is changed to etch only the oxide film, and the oxide film 104 is removed. The type of etching gas is further changed to etch only the nitride film, and the nitride film 103 is etched with the undoped polysilicon 108 used as a mask. As a result, a nitride film sidewall 106 is formed as the sidewall of the gate (FIG. 2I). At this time, the nitride film sidewall 106 may be also etched by isotropic etching.

Figure 2J:
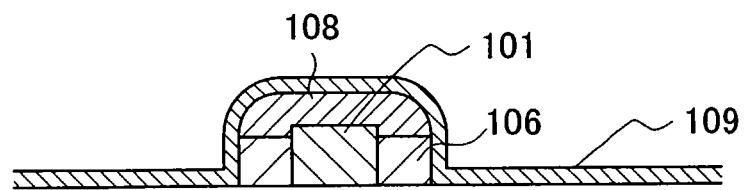

Next, high melting point metal, e.g., titanium (or cobalt) 109 having a thickness of about 20 nm is formed on the entire surface of the substrate by a sputtering method (FIG. 2J). Further, RTA (Rapid Thermal Annealing) is conducted twice, e.g., at 520° C. and 850° C., thereby siliciding the undoped polysilicon 108 to form a titanium silicide (or cobalt silicide) film 110. At this time, a diffusion layer region is also silicided to decrease resistance. Unreacted titanium (or cobalt) is then removed. As a result, the gate as shown in FIG. 1 can be obtained.

As described so far, to form the wide upper gate electrode on the thin lower gate electrode, the upper gate electrode is formed in a self-aligned manner only by forming and etching back the respective films in the first embodiment, as compared with the conventional method in which the upper gate electrode is formed by photolithography and etching. Therefore, the upper gate electrode can be easily formed with good yield. In addition, due to lack of the photolithographic step, it is possible to form the gate electrode even if the gate is made further thinner and to thereby greatly decrease the number of steps.

Furthermore, as for the silicided gate, the lower gate region, into which impurities are injected simultaneously with the injection of the impurities into the diffusion layer region, is not silicided but the undoped polysilicon on the wide upper gate region is silicided. By doing so, the undoped polysilicon is reacted with titanium or cobalt without being hampered by the impurities and the resistance of the gate can be completely decreased.

Moreover, as for the CMOS transistors, the PMOS and NMOS transistors have different silicide reactions due to the difference in impurities injected thereinto and the forms of the gates thereof become irregular in the conventional method. In this embodiment, impurities are not injected in the undoped polysilicon on the wide upper gate portion, undoped polysilicon is silicided with titanium or cobalt in each of the NMOS and PMOS transistors, so that no irregularities are generated in form and resistance.

Second Embodiment

FIGS. 3A to 3J show cross-sectional views showing the steps of forming a gate portion in the second embodiment according to the present invention.

Figure 3A:
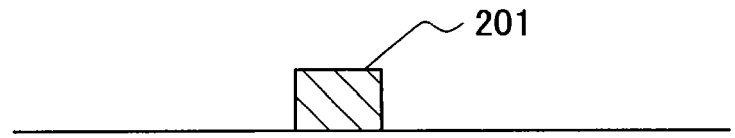

Similarly to the first embodiment, first polysilicon having a design gate length, e.g., rectangular gate polysilicon 201 having a gate length of about 150 nm is formed as a lower gate electrode (FIG. 3A). Thereafter, in order to obtain the LDD structure, impurities are injected into source and drain regions with the gate polysilicon 201 used as a mask to thereby form, for example, a low concentration n type layer (not shown).

Figure 3B:
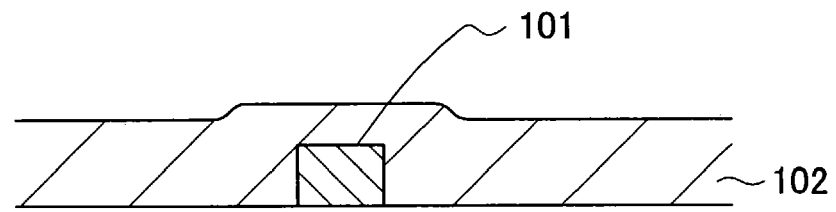

Next, a nitride film 202, for example, is formed as the first insulating film on the entire surface of the substrate so as to cover the gate polysilicon 201 by a CVD method (FIG. 3B). In this case, the nitride film 202 is formed to set the thickness thereof to be larger than the height of the gate polysilicon 201 and to leave the difference in height around the gate polysilicon 201. The thickness of the nitride film 202 is preferably about 200 nm.

Figure 3C:
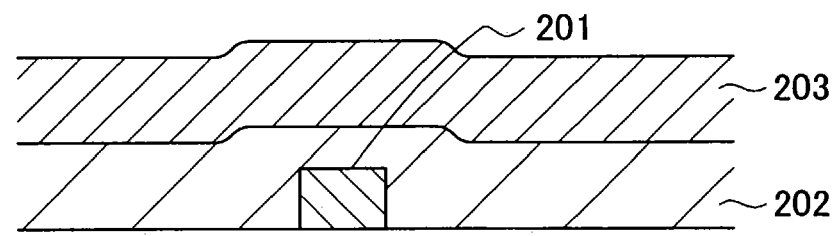

Further, an oxide film 203, for example, is formed as the second insulating film on the nitride film 202 by the CVD method to have a thickness of, for example, about 300 nm (FIG. 3C). At this time, it is preferable that the oxide film 203 is flattened so that the difference in height around the upper portion of the gate polysilicon 201 is relaxed by the thickness of the oxide film 203 and smaller than the difference in height of the nitride film 202.

Figure 3D:
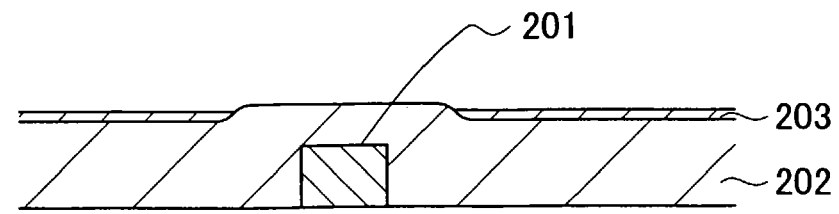
Figure 3E:
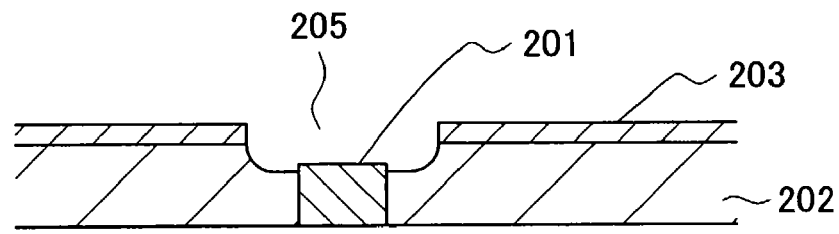

Thereafter, the flattened oxide film 203 is etched back to expose the nitride film 202 on the gate polysilicon 201 (FIG. 3D). The type of etching gas is then changed to etch only the exposed nitride film 202, and the upper surface of the gate polysilicon 201 is exposed (FIG. 3E). As a result, a space 205 is formed on the gate polysilicon 201.

Figure 3F:
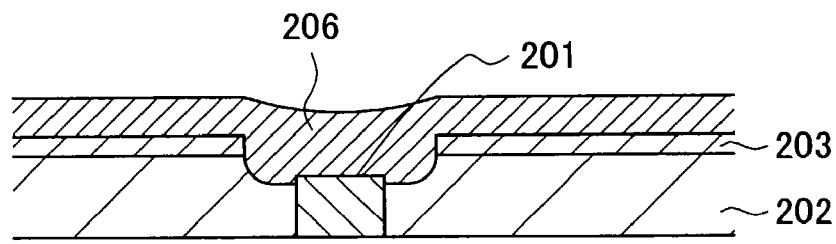
Figure 3G:
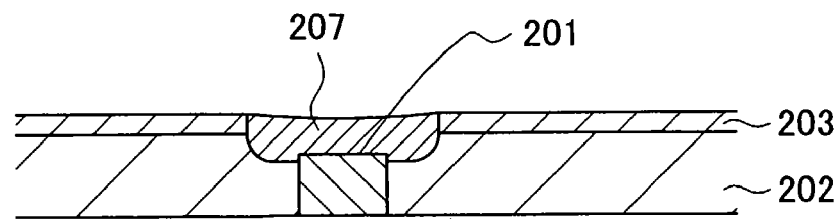

Thereafter, undoped polysilicon 206 is formed as the second polysilicon on the entire surface, and the space 205 is buried (FIG. 3F). At this time, the undoped polysilicon 206 is formed to have a thickness of about 200 nm, and a dent in the space 205 is flattened. The entire surface of the substrate is then etched back until the oxide film 203 is exposed, and undoped polysilicon 207 is left in the space 205 (FIG. 3G). The undoped polysilicon 207 becomes an upper gate electrode.

Figure 3H:
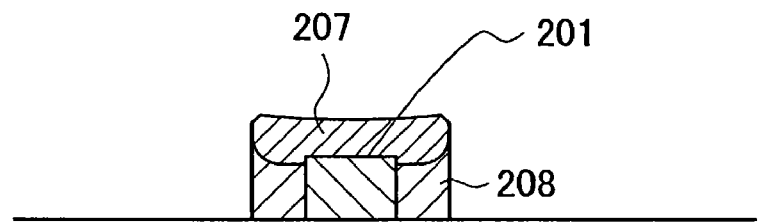
Figure 3I:
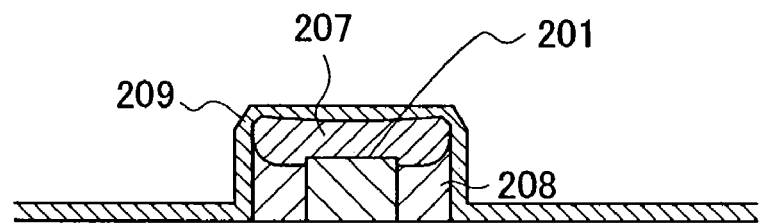

The type of etching gas is changed to remove the oxide film 203 and the nitride film 202. Using the undoped polysilicon 207 on the gate polysilicon 201 as a mask, a nitride film sidewall 208 is formed as the sidewall of the gate (FIG. 3H). At this time, the nitride film sidewall 208 may be also etched by isotropic etching. Further, to obtain the LDD structure, impurities are injected into the source and drain regions with the undoped polysilicon 207 as a mask, thereby forming, for example, a high concentration, deep n type layer (not shown).

Figure 3J:
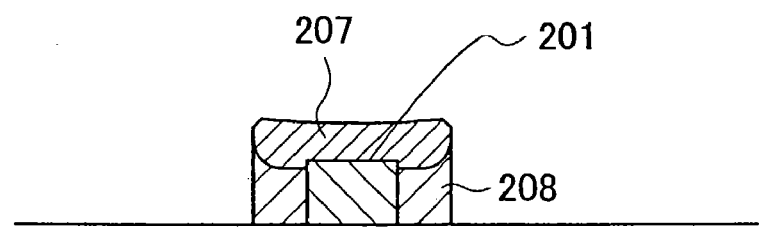

Titanium (or cobalt) 209 is formed on the entire surface by the sputtering method (FIG. 3I), the undoped polysilicon 207 on the gate polysilicon 201 is silicided by RTA and a titanium silicide (or cobalt silicide) film 210 is formed. At this time, a diffusion layer region is also silicided simultaneously. Thereafter, unreacted titanium or cobalt is removed. As a result, the gate as shown in FIG. 3J can be obtained.

As described so far, similarly to the first embodiment, it is possible to form the wide polysilicon on the thin lower gate electrode without using a photolithographic step. It is thereby possible to decrease the number of steps of forming the gate and to improve yield.

In the first embodiment, the oxide film is etched back so as to leave the nitride film on the first gate polysilicon after forming the oxide film on the entire surface of the substrate. In the first embodiment, due to the difference in etching rate in the plane and the difference in pattern density, portions on which the upper surface of the rectangular gate polysilicon is exposed without leaving the nitride film are sometimes generated locally. As a result, there is a probability that the space to be surrounded by the oxide film and obtained by forming and then etching back the oxide film and etching the nitride film cannot be formed and the upper gate buried with the undoped polysilicon cannot be formed.

In the second embodiment, by contrast, the nitride film is formed thick and the oxide film is then formed thick on the nitride film. By doing so, the difference in height of the oxide film around the upper portion of the gate polysilicon is relaxed as compared with the first embodiment. In the later etch-back step, it is possible to ensure exposing the nitride film on the gate polysilicon in the plane. It is thus possible to form a space surrounded by the oxide film and the nitride film on the gate polysilicon after etching the nitride film and to bury the undoped polysilicon.

The preferred embodiments of the semiconductor device manufacturing method according to the present invention have been described so far with reference to the accompanying drawings. However, the present invention is not limited to these embodiments. It is obvious to a person having ordinary skill in the art that various changes and modifications can be made within the scope of the technical concept as defined in the claims which follow. It is appreciated that such changes and modifications naturally fall within the technical scope of the present invention.

Furthermore, it is possible to form an ordinary T type gate electrode which is not required to be silicided using the first or second embodiment. In that case, the lower gate electrode corresponds to any metal which may become a gate and the siliciding step as executed in the first or second embodiment becomes unnecessary.

As described so far, according to the present invention, in the semiconductor device manufacturing method including forming the wide region on the upper portion of the gate, the wide region can be formed in a self-aligned manner only by the film formation step and the film etching step without using the photolithographic step. Therefore, it is possible to form the semiconductor device with simple steps, good yield and low cost.

What is claimed is:

1. A semiconductor device manufacturing method comprising a step of siliciding a polysilicon gate, the method comprising steps of:
   forming first polysilicon serving as a gate on a semiconductor substrate;
   forming a first insulating film on said semiconductor substrate to cover said first polysilicon, to be thicker than said first polysilicon and to leave a difference in height around said first polysilicon;
   forming said first insulating film to be thinner than said first polysilicon by etching back using a dry etching method on a whole surface thereof after the step of forming said first insulating film to be thicker than said first polysilicon;
   forming a second insulating film on said whole surface of said first insulating film to have such a thickness as to flatten a difference in height near said first polysilicon;
   selectively etching said second insulating film by an etch back method until said first insulating film located on an upper surface of said gate is exposed;
   selectively etching said first insulating film located on the upper surface of said gate until the upper surface of said gate is exposed;
   burying a space in which said first insulating film is etched, and forming second polysilicon on said second insulating film;
   etching said second polysilicon, exposing said second insulating film, and leaving said second polysilicon in said space;
   etching said second insulating film;
   etching said first insulating film;
   forming high melting point metal covering said second polysilicon;
   siliciding said second polysilicon by a heat treatment; and
   removing an unreacted portion of said high melting point metal.

2. The semiconductor device manufacturing method according to claim 1, wherein
   a condition for etching said first insulating film is that said second insulating film is hardly etched.

3. The semiconductor device manufacturing method according to claim 1, wherein
   said second polysilicon is formed to have such a thickness as to flatten a difference in height near said space.

4. The semiconductor device manufacturing method according to claim 1, wherein
   said second polysilicon is undoped polysilicon.

5. The semiconductor device manufacturing method according to claim 1, wherein
   said high melting point metal is one of titanium and cobalt.

6. A semiconductor device manufacturing method comprising a step of siliciding a polysilicon gate, the method comprising steps of:
   forming first polysilicon serving as a gate on a semiconductor substrate;
   forming a first insulating film on said semiconductor substrate to cover said first polysilicon, to be thicker than said first polysilicon and to leave a difference in height around said first polysilicon;
   forming said first insulating film to be thinner than said first polysilicon by etching back a whole surface thereof after the step of forming said first insulating film to be thicker than said first polysilicon;
   forming a second insulating film on said whole surface of said first insulating film to have such a thickness as to flatten a difference in height near said first polysilicon;
   selectively etching said second insulating film by an etch back method until said first insulating film located on an upper surface of said gate is exposed;
   selectively etching said first insulating film located on the upper surface of said gate until the upper surface of said gate is exposed;
   burying a space in which said first insulating film is etched, and forming second polysilicon on said second insulating film;
   etching said second polysilicon, exposing said second insulating film, and leaving said second polysilicon in said space;
   etching said second insulating film;
   etching said first insulating film;
   forming high melting point metal covering said second polysilicon;
   siliciding said second polysilicon by a heat treatment; and
   removing an unreacted portion of said high melting point metal.

7. The semiconductor device manufacturing method according to claim 6, wherein
   a dry etching method is used for etching.

8. The semiconductor device manufacturing method according to claim 6, wherein
   a condition for etching said first insulating film is that said second insulating film is hardly etched.

9. The semiconductor device manufacturing method according to claim 6, wherein
   said second polysilicon is formed to have such a thickness as to flatten a difference in height near said space.

10. The semiconductor device manufacturing method according to claim 6, wherein
    said second polysilicon is undoped polysilicon.

11. The semiconductor device manufacturing method according to claim 6, wherein
    said high melting point metal is one of titanium and cobalt.

* * * * *